(12) United States Patent
Allen

(10) Patent No.: US 7,228,034 B2
(45) Date of Patent: Jun. 5, 2007

(54) INTERFERENCE PATTERNING

(75) Inventor: Gary Allen, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 241 days.

(21) Appl. No.: 10/701,292

(22) Filed: Nov. 3, 2003

(65) Prior Publication Data
US 2005/0094152 A1 May 5, 2005

(51) Int. Cl.
*G01B 9/02* (2006.01)
(52) U.S. Cl. .................................. 385/37; 356/450
(58) Field of Classification Search ............... 385/37; 356/450
See application file for complete search history.

(56) References Cited

U.S. PATENT DOCUMENTS 5,142,385 A    8/1992    Anderson et al.
5,642,209 A  * 6/1997    Baker .......................... 359/10
5,646,730 A  * 7/1997    Mitchell et al. ............ 356/499
5,892,597 A    4/1999    Iwata et al.

FOREIGN PATENT DOCUMENTS

JP           60-229001           11/1985

* cited by examiner

*Primary Examiner*—Frank G. Font
*Assistant Examiner*—Mary El-Shammaa
(74) *Attorney, Agent, or Firm*—Fish & Richardson P.C.

(57) ABSTRACT

Interference patterning of substrates. An interference pattern including an interference fringe may be generated to illuminate a substrate, the area on the substrate actually illuminated by the interference pattern can be limited, the illuminated area can be displaced across the substrate in a direction crossing the interference fringe, and a substantially constant position of the interference pattern relative to the substrate can be maintained despite the displacement of the illuminated area.

14 Claims, 10 Drawing Sheets

INTERFERENCE PATTERNING

BACKGROUND

This disclosure relates to the interference patterning of substrates.

An interference pattern results when two or more wave trains (e.g., electromagnetic radiation) constructively and/or destructively add to form alternating areas of increased and decreased intensity. Interferometric lithography can be used to print features on substrates with pitches approaching one half the wavelength of the wave train.

DESCRIPTION OF DRAWINGS

Like reference symbols in the drawings indicate like elements.

DETAILED DESCRIPTION

Figure 1:
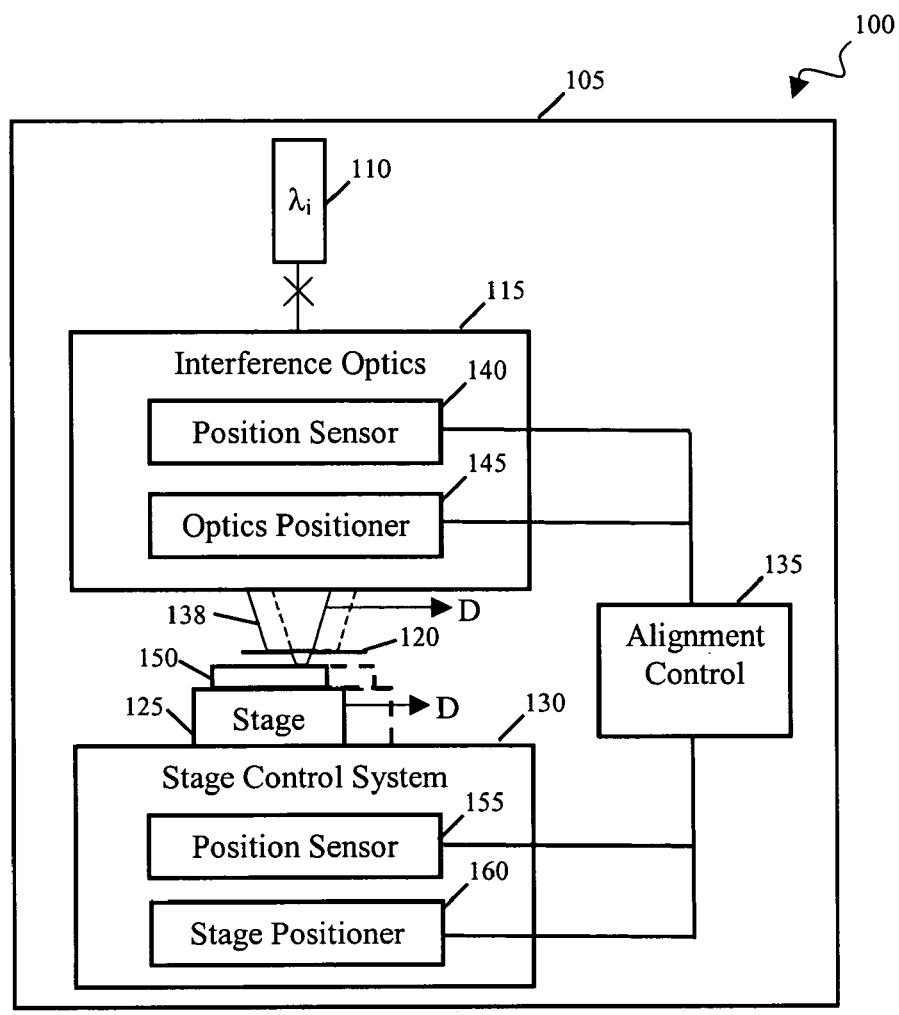
FIG. 1 shows an implementation of an interference pattern scanning lithography system.

FIG. 1 shows a interference pattern scanning lithography system 100. System 100 includes an environmental enclosure 105, a collimated electromagnetic radiation source 110, interference optics 115, a spatial filter 120, a substrate stage 125, a stage control system 130, and an alignment control 135.

Enclosure 105 may be used for printing features on substrates. Enclosure 105 can provide environmental stability and protection against airborne particles and other sources of printing defects. Enclosure 105 can be a clean room or a dedicated environmental system to be placed inside a clean room. Enclosure 105 can enclose all or a subset of source 110, interference optics 115, spatial filter 120, wafer stage 125, stage control system 130, and alignment control 135. For example, alignment control 135 can be external to enclosure 105 whereas source 110, interference optics 115, spatial filter 120, substrate stage 125, stage control system 130 can be enclosed by enclosure 105.

Collimated electromagnetic radiation source 110 can be a laser, an arc lamp, a synchrotron, or other device that, alone or in conjunction with optical elements, generates collimated electromagnetic radiation.

Interference optics 115 provides for interferometric patterning of substrates using two or more interfering electromagnetic wave trains. The wave trains can interfere to form an interference pattern at a desired location. The interference pattern can include one or more interference fringes. The interference fringes can have substantially the same orientation (e.g., parallel groups of fringes at the desired location) or the fringes can have different orientations (e.g., perpendicular groups of fringes at the desired location).

The wave trains can exit interference optics 115 along an optical path 138. The wave trains can be generated using electromagnetic emissions from source 110. For example, interference optics 115 can include a beam splitter and two opposing mirrors. The beam splitter can split a beam emitted from source 110 into a pair of beams that are subsequently interfered after reflection from the mirrors to generate an interference pattern of lines and spaces on a substrate.

Interference optics 115 includes a position sensor 140 and an optics positioner 145. Position sensor 140 can transduce the position of the optical elements in interference optics 115. Position sensor 140 may also be able to detect the interference pattern formed by interference optics 115, as well as the position of the substrate illuminated by the interference pattern (e.g., using wafer alignment marks). Optics positioner 145 imparts motion to optical elements in interference optics 115 to change the illumination of the substrate based, in part, on the position(s) transduced by sensor 140. One example of such a change in illumination is the movement of optical path 138 in a direction D, as discussed further below. Another example of such a change in illumination is a change in the interference pattern resulting from phase shifting of one or more of the wavetrains, also discussed further below. Optics positioner 145 can be a motor or other displacement device, such as a device including a piezoelectric element.

Figure 2:
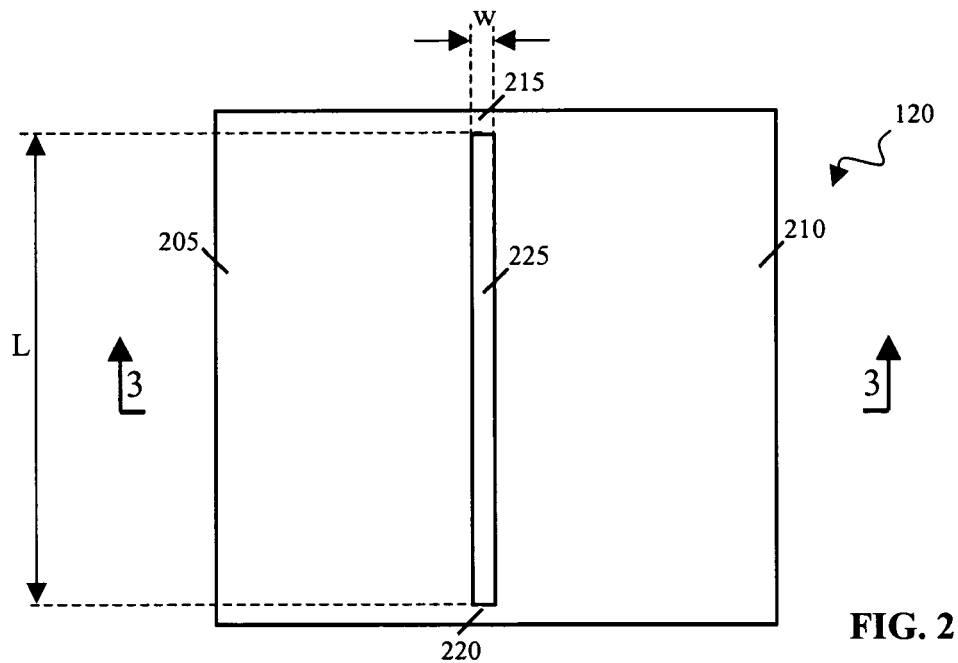
FIG. 2 show a spatial filter for use in an interference pattern scanning lithography system.
Figure 3:
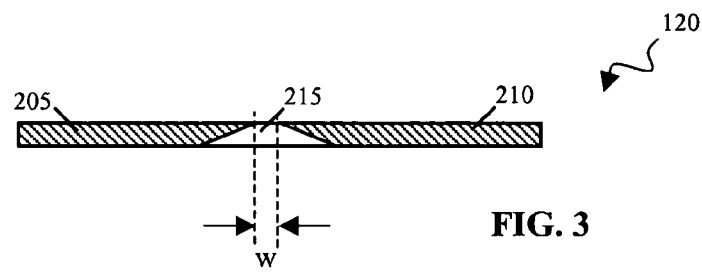
FIG. 3 shows a sectional view of the spatial filter of FIG. 2.

Spatial filter 120 spatially defines an area illuminated by the wave trains from interference optics 115. FIGS. 2 and 3 show spatial filter 120 in increased detail. Filter 120 includes a first portion 205 and a second portion 210. Portions 205, 210 are joined by a pair of bridges 215, 220. Portions 205, 210 and bridges 215, 220 can curtail the transmission of the electromagnetic radiation emitted from interference optics 115. Together, portions 205, 210 and bridges 215, 220 define an interior aperture 225. Spatial filter 120 can transmit illumination through aperture 225 and hinder or block the transmission of the same illumination through portions 205, 210 and bridges 215, 220 to spatially define an illuminated area.

Interior aperture 225 can have a width w and a length L. For the illustrated orientation relative to the interfering wavetrains, width w is generally smaller than length L. For example, width w can allow a certain number of interference fringes (e.g., between 10 and 50000 interference fringes) to illuminate an underlying substrate. Length L can be chosen to illuminate a certain portion of the width of a substrate. A relatively large length L allows a large portion of a substrate to be printed simultaneously, increasing throughput. For example, length L can be chosen so that the entire width of a wafer (e.g., a 300 mm wafer) is illuminated. Dimensions L and w can thus be selected to provide a relatively large area of uniform illumination of a substrate through aperture 225.

FIG. 1 shows substrate stage 125 including a chuck 150. Chuck 150 is operative to immobilize a substrate for lithographic processing. Chuck 150 can be a vacuum chuck that uses a vacuum to immobilize the substrate. Stage 125, along with chuck 150, is movable by stage control system 130 to present the appropriate portion of an immobilized substrate to an appropriate portion of an interference fringe. For example, stage 125 is movable in the direction D, as discussed further below.

Stage control system 130 includes a position sensor 155 and a stage positioner 160. Position sensor 155 can transduce the position of stage 125. Position sensor 155 can include any of a number of transductive elements, including interferometric transducers, linear variable differential transducers, piezoelectric transducers, and resistive transducers. Stage positioner 160 imparts motion to stage 125 to change the position of an immobilized substrate relative to spatial filter 120. Stage positioner 160 can be a motor or other displacement device.

Alignment control 135 is a control system for regulating the movement and positions of stage 125 and optical elements in interference optics 115. Alignment control 135 receives information regarding the position of optical elements in interference optics 115, the position of stage 125, as well as the position of a substrate mounted on stage 125 from sensors 140, 155. In turn, alignment control 135 provides control signals based on the received position information to positioners 145, 160. Alignment control 135 can be a closed loop control system.

In operation, alignment control 135 ensures that an immobilized substrate is maintained at a substantially constant position relative to an interference pattern despite any displacements in the interference patterning system. FIGS. 4–7 show an example implementation of the positioning provided by alignment control 135 with an interference pattern of lines and spaces.

Figure 4:
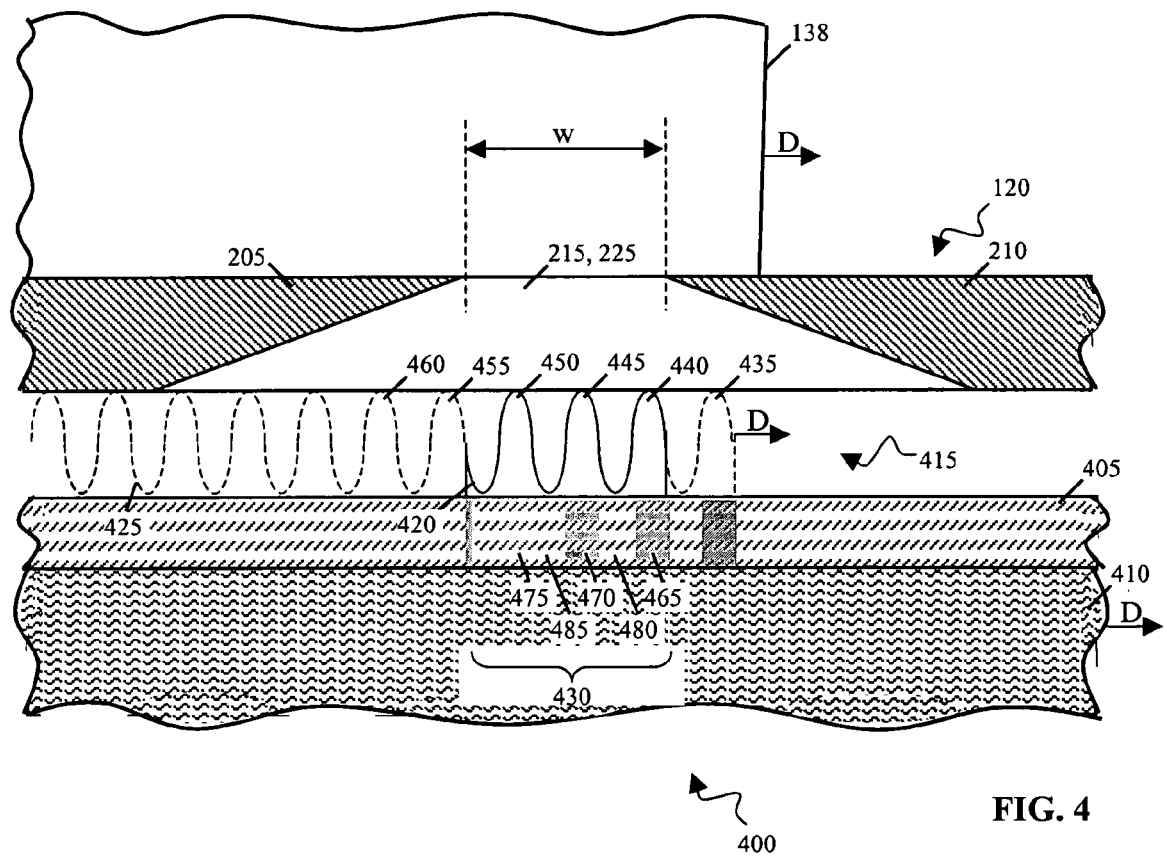
FIG. 4 shows a stage in the interference lithographic patterning of a substrate.

In particular, FIG. 4 shows a first stage in the interference lithographic patterning of a substrate 400. Substrate 400 can be a wafer being processed to form at least one integrated circuit device such as a microprocessor, a chipset device, or a memory device. Substrate 400 can include semiconductive portions made from silicon, gallium arsenide, or indium phosphide.

Substrate 400 includes a resist layer 405 and a resist support 410. Resist layer 405 is a material that is sensitive to the electromagnetic radiation emitted by source 110 (FIG. 1). For example, resist layer 405 can be a positive or negative photoresist. Resist support 410 is a material capable of physically supporting resist layer 405. For example, resist support 410 can be the base wafer or an additional layer itself supported (directly or indirectly) by the base wafer. Resist support 410 can include preexisting features.

During patterning of substrate 400, source 110 and interference optics 115 (FIG. 1) emit electromagnetic radiation capable of creating an interference pattern 415. Interference pattern 415 includes a transmitted portion 420 (shown in solid) and an untransmitted portion 425 (shown in dashed). Transmitted portion 420 passes through aperture 225 to illuminate a working portion 430 of substrate 400. Untransmitted portion 425 is blocked or attenuated by spatial filter 120 (FIG. 1). The lines and spaces of interference pattern 415 are substantially parallel with the length L of aperture 225.

Interference pattern 415 includes a series of intensity peaks 435, 440, 445, 450, 455, 460 where two or more wavetrains constructively interfere. Intensity peaks can result from a collection of linear interference fringes. The fringes can be directed perpendicularly to the plane of the page or at an angle relative to the plane of the page. The geometry, angle, and pitch of intensity peaks 435, 440, 445, 450, 455, 460 can be tailored, for example, using the wavelengths and number of wavetrains, the phase of the interfering wavetrains, the geometry of system 100, and the angle of the wavetrains relative to substrate 400. In the processing stage shown in FIG. 4, intensity peaks 435, 455, 460 are in untransmitted portion 425 and thus do not illuminate substrate 400. On the other hand, intensity peaks 440, 445, 450 are within transmitted portion 420 and thus illuminate substrate 400. As discussed above, transmitted portion 420 can include significantly more interference fringes, and hence more intensity peaks, than shown. However, for the sake of clarity of illustration, the number of intensity peaks in transmitted portion 420 has been limited.

At the same time that intensity peaks 440, 445, 450 illuminate substrate 400, peaks 440, 445, 450 also expose lines 465, 470, 475 in resist layer 405. Lines 465, 470, 475 are separated by unexposed spaces 480, 485. The exposure of lines 465, 470, 475 is not uniform, as represented by the differing pixel densities of lines 465, 470, 475. In particular, line 465 has received more exposure than line 470, and line 475 has received less exposure than line 470. These differences in exposure are a consequence of the movement and positioning of stage 125 and interference pattern 415 as regulated by alignment control 135 (FIG. 1).

In particular, alignment control 135 ensures that substrate 400 and interference pattern 415 are maintained in a substantially constant position relative to each other despite the displacement of working portion 430 across substrate 400. Substrate 400 and interference pattern 415 are translated together in the same direction D across aperture 225. Direction D can be substantially perpendicular to aperture 225 and transverse to the fringes forming intensity peaks 435, 440, 445, 450, 455, 460 so that peaks 435, 440, 445, 450, 455, 460 traverse working portion 430 in conjunction with exposed lines 465, 470, 475 without exposing intervening spaces such as spaces 480, 485.

Figure 5:
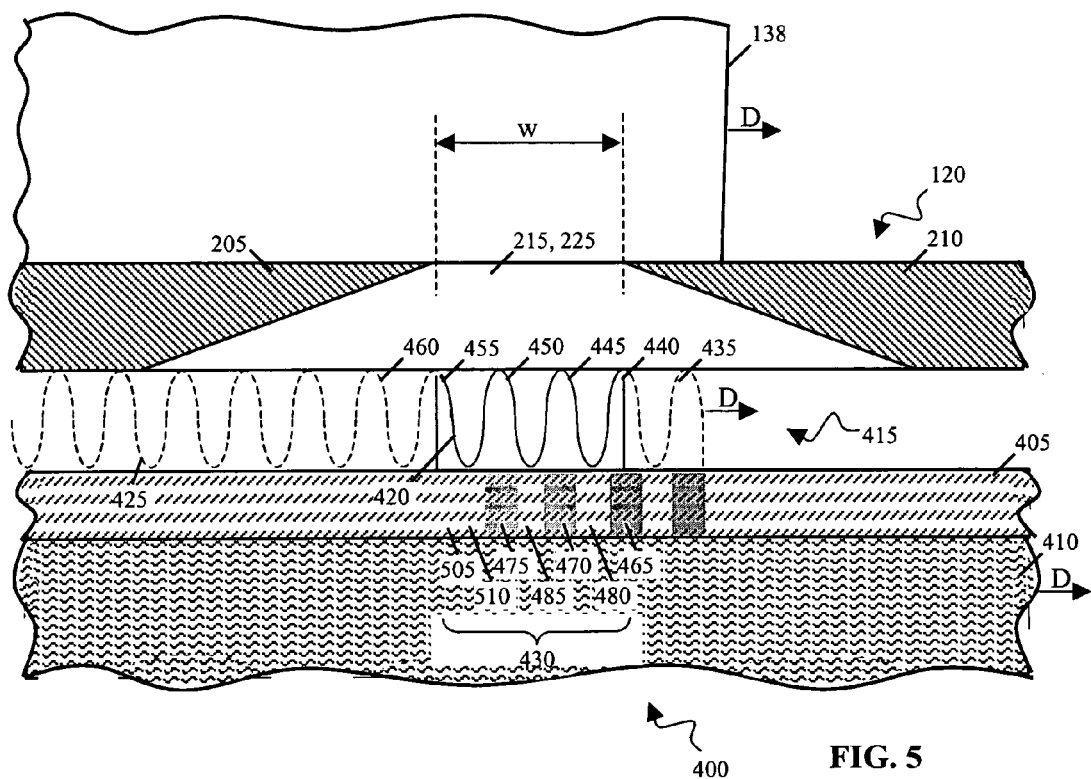
FIGS. 5–7 show subsequent stages in the interference lithographic patterning of the substrate of FIG. 4.

As exposed lines 465, 470, 475 traverse working portion 430, their exposure increases. FIG. 5 shows a second, subsequent stage in the interference lithographic patterning of substrate 400. Linear intensity peak 440 has moved to the edge of working portion 430 and, in part, no longer illuminates substrate 400. The exposure of lines 465, 470, 475 has increased, as represented by the increased pixel densities. A new line 505, separated from line 475 by a space 510, is exposed by linear intensity peak 455 as it enters working portion 430. The movement of intensity peaks 435, 440, 445, 450, 455, 460, along with the rest of interference pattern 415, is effectuated by the movement of optical path 138 across spatial filter 120.

Figure 6:
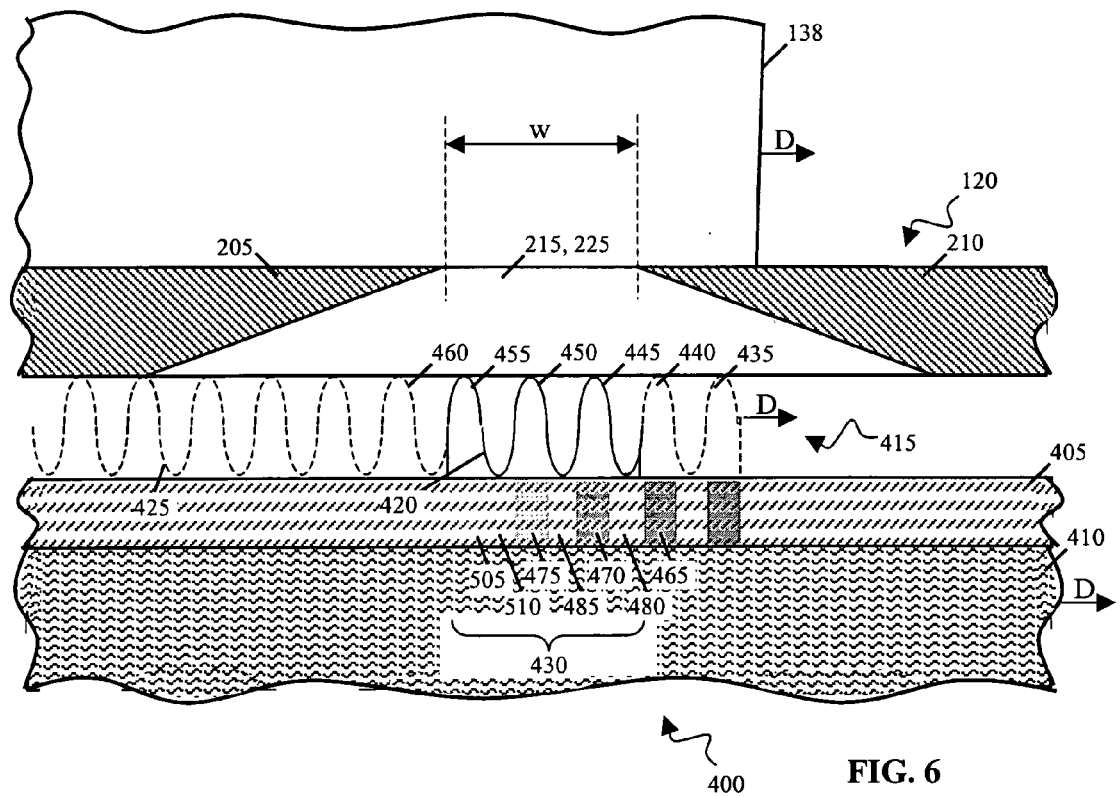

FIG. 6 shows a third, more subsequent stage in the interference lithographic patterning of substrate 400. Linear intensity peak 440 has moved entirely outside working portion 430 and does not illuminate substrate 400. The exposure of lines 465, 470, 475 has increased. Line 505 has moved entirely into working portion 430 and is being exposed by linear intensity peak 455.

Figure 7:
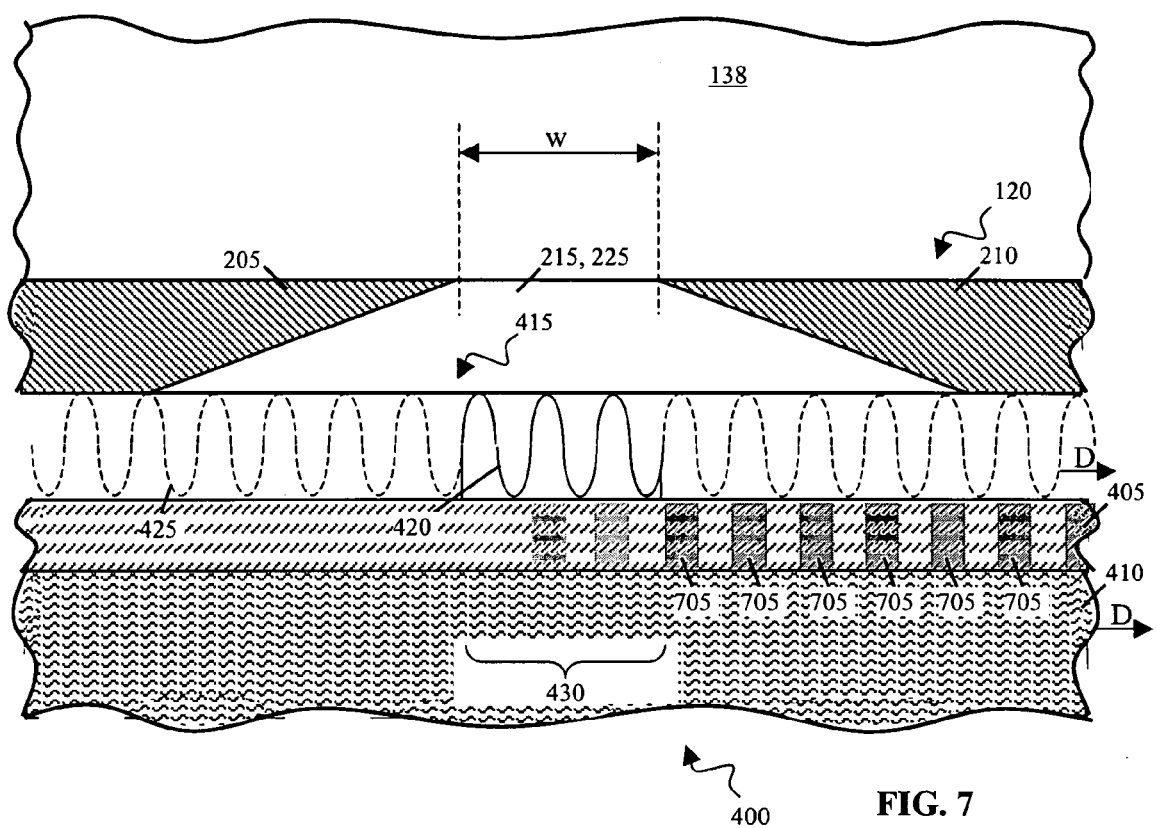

FIG. 7 shows a fourth, still more subsequent stage in the interference lithographic patterning of substrate 400. Resist layer 405 includes a series of exposed lines 705, and new lines are continuously being exposed in working portion 430 by interference pattern 415.

Figure 8:
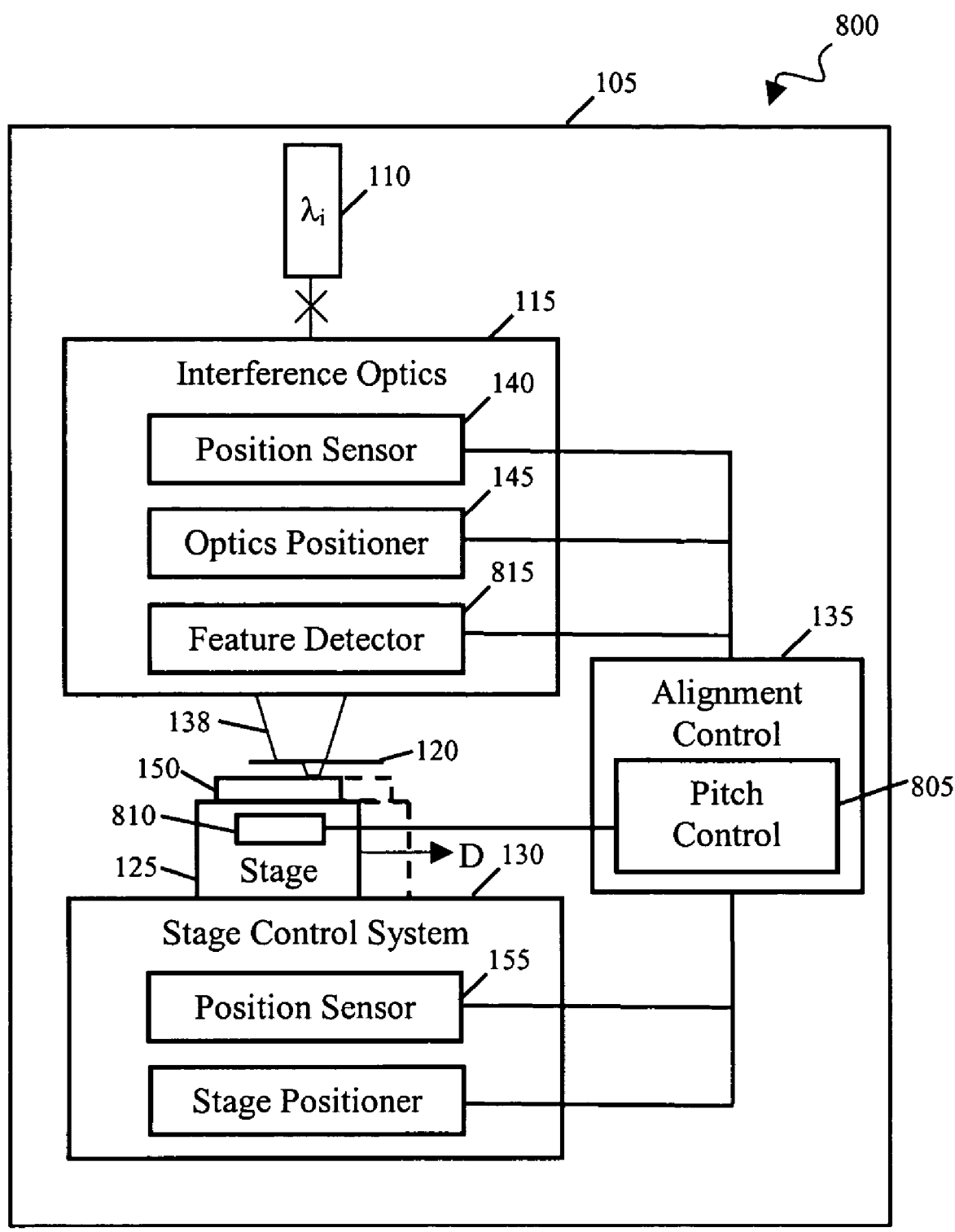
FIG. 8 shows another implementation of an interference pattern scanning lithography system.

FIG. 8 illustrates another implementation of a system for interference lithographic patterning. In particular, a system 800 additionally includes an pitch control 805, an interference pattern pitch sensor 810, and a feature detector 815. Feature detector 815 detects the position of preexisting features on a substrate. Detected preexisting features can include wafer alignment marks or other previously patterned features. Feature detector 815 can be an optical system that relies on pattern recognition or diffraction from repetitive preexisting features to detect the position of the features.

Pitch sensor 810 senses the pitch of interference pattern 415. For example, pitch sensor 810 can include one or more photodetectors covered by a small aperture and positioned in the same plane as a substrate on stage 125. As interference pattern 415 is displaced, interference pattern 415 can cross the pitch sensor aperture and yield a series of intensity variations indicative of the pitch of interference pattern 415.

Pitch control 805 regulates the pitch of features on a substrate printed with interference pattern 415. Pitch control 805 can regulate the pitch using any of a number of different approaches. For example, pitch control 805 can use differences in the displacement speed of interference pattern 415 and stage 125 to regulate the pitch of printed features. When such differences in displacement speed are small (e.g., when the position of the interference pattern relative to the first location is constant in working portion 430 to within a pitch of the interference pattern, such as when the position of the interference pattern is constant to within 1% of the pitch of the interference pattern), the pitch of features printed using the interference pattern can be regulated. As another example of an approach to the regulation of pitch, pitch control 805 can provide a signal to optics positioner 145 to change the position (or the rate of change of the position) of optical elements in interference optics 115.

Figure 9:
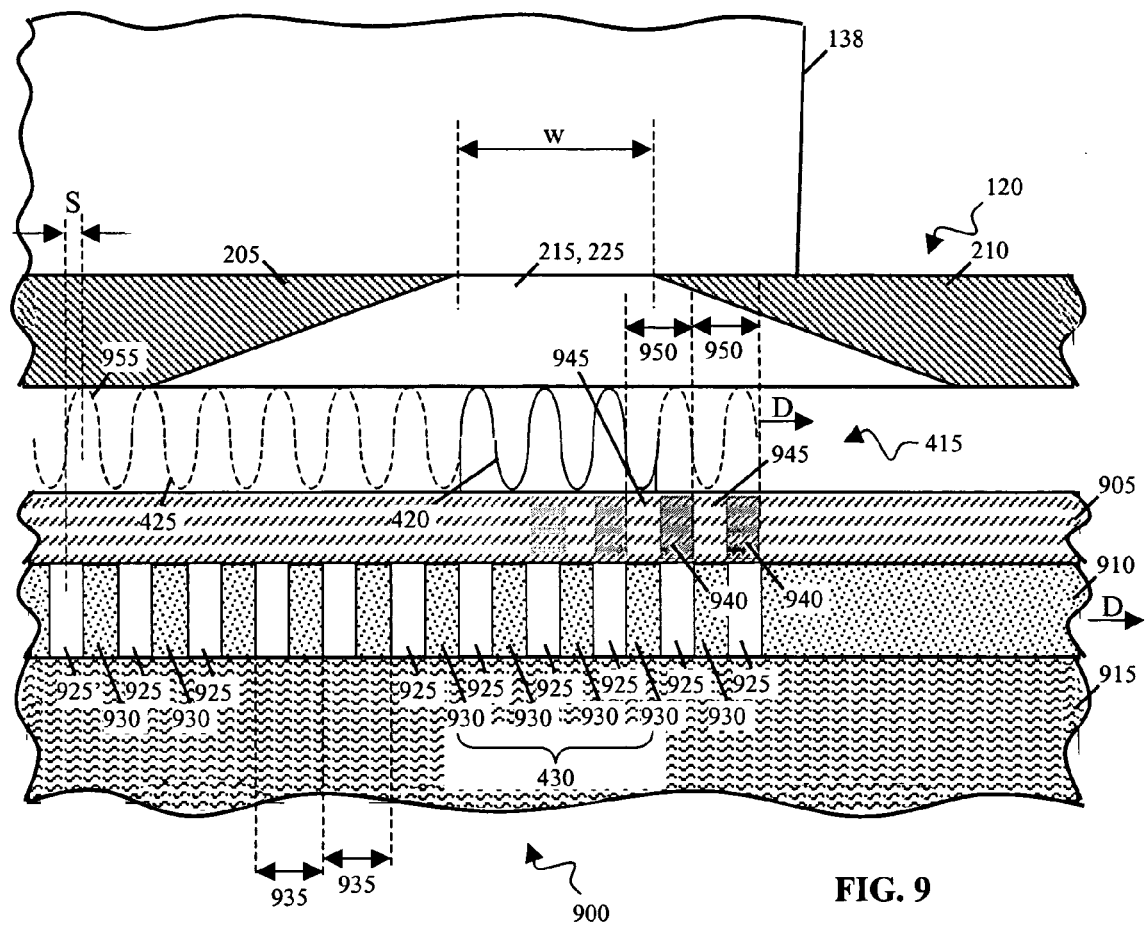
FIGS. 9–10 show stages in the interference lithographic patterning of a substrate.
Figure 10:
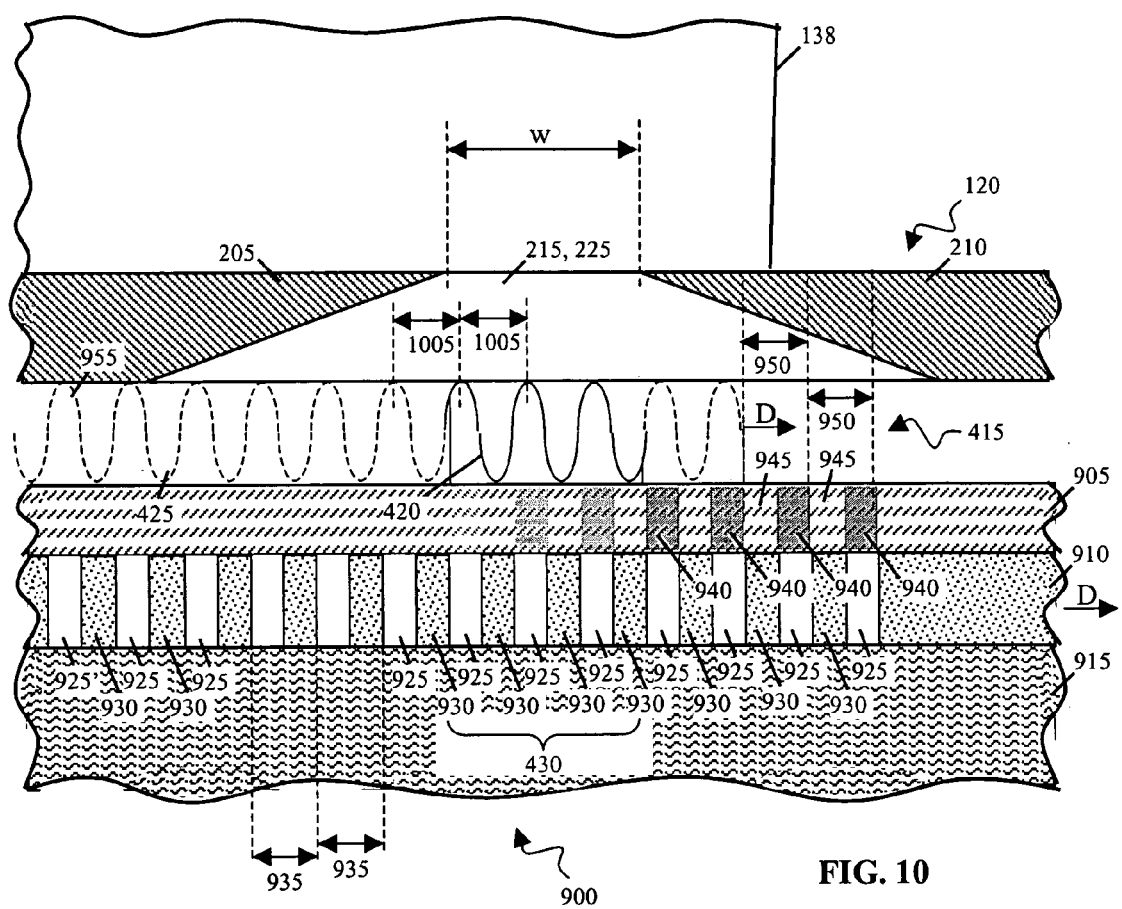

Pitch control 805 can base such regulation on information received from sensors 140, 155, 810, 815. Pitch control 805 can be a closed loop control system. The pitch regulation provided by pitch control 805 can be used to adjust the pitch of newly patterned features to prevent misregistration with other features or to achieve pitches that are not uniform across a substrate. FIGS. 9 and 10 show an example implementation of the regulation provided by pitch control 805.

In particular, FIG. 9 shows a substrate 900 at a first stage in the interference lithographic patterning. Substrate 900 includes a resist layer 905, a patterned layer 910, and a pattern support 915. Resist layer 905 is a material that is sensitive to the electromagnetic radiation emitted by source 110 (FIG. 8). Patterned layer 910 supports resist layer 905, either directly (as shown) or indirectly by way of an intervening layer (not shown). Patterned layer 910 is a portion of substrate 900 that includes preexisting features. The preexisting features can form all or a portion of a microelectronic device. Pattern layer 910 can include, for example, electrical insulators such as silicon dioxide or nitride, semiconducting materials such as p- or n-doped silicon, or conducting materials such as copper or aluminum.

As shown, patterned layer 910 includes a series of trenches 925 separated by spaces 930. Trenches 925 have a pitch 935. Pitch 935 is the sum of the width of a trench 925 and a space 930 in a direction perpendicular to their orientation.

In operation, interference lithographic patterning system 800 (FIG. 8) exposes a series of lines 940 using interference pattern 415. Exposed lines 940 are separated by a series of spaces 945. Exposed lines 940 can have a pitch 950, equal to the sum of the width of line 940 and the width of space 945.

Pitch control 805 can receive information regarding the pitch of interference pattern 415 from pitch sensor 810. Pitch control 805 can receive information regarding preexisting feature pitch 935 from feature detector 815. Pitch control 805 can use additional information from position sensors 140, 155 to generate a control signal to regulate pitch 950 of lines printed with interference pattern 415.

At some point during the exposure process, exposed line pitch 950 may be greater than or less than feature pitch 935. With such a difference in pitch, a registration error may eventually arise between trenches 925 and lines 940. For example, in FIG. 9, pitch 935 is larger than pitch 950. Even though exposed lines 940 may register with corresponding trenches 925, subsequently exposed lines (not shown) may not register with corresponding trenches 925. Such potential misregistration is illustrated in FIG. 9 by a separation distance S between the center of a particular trench 925' and the center of a particular intensity peak 955 in the untransmitted portion 425 of interference pattern 415. Over large spans across substrate 900, such misregistration may prevent the accurate alignment of features in different layers.

FIG. 10 illustrates the regulation of the interferometric patterning of substrate 900 by pitch control 805 (FIG. 8). In particular, pitch control 805 can dynamically control a pitch 1005 of interference pattern 415 during the exposure of lines 940. Pitch 1005 is the spatial periodicity of interference pattern 415 in the direction perpendicular to the intensity peaks of interference pattern 415. Pitch control 805 can control pitch 1005 by minor differences in the displacement speed of interference pattern 415 and substrate 900 or by changes to the positioning of optical elements in interference optics 115 effectuated by optics positioner 145 (FIG. 8).

FIG. 10 also illustrates another approach to the displacement of interference pattern 415. In particular, interference pattern 415 is displaced by changing the phase of one or more of the wavetrains that interfere to form interference pattern 415, rather than by displacement of optical path 138. Such changes to phase can be used to displace intensity peaks across working portion 430 in the same manner as discussed above in regards to FIGS. 4–7. Such changes to phase can be effectuated by optics positioner 145 under the direction of alignment control 135.

Thus, both the pitch and the location of features formed using interference lithography can be regulated across substrate 900. For example, control of interference pattern pitch 1005 can be used to maintain a constant pitch 950 of lines 940 across even relatively wide substrates, while phase changes can be used align the constant pitch with preexisting features before printing. Control of interference pattern pitch 1005 can also be used to change the pitch 950 of lines 940 at different positions across a substrate. As another example, pitch 1005 and print location can be controlled to prevent misregistration errors between preexisting features and features formed using interference lithography.

Figure 11:
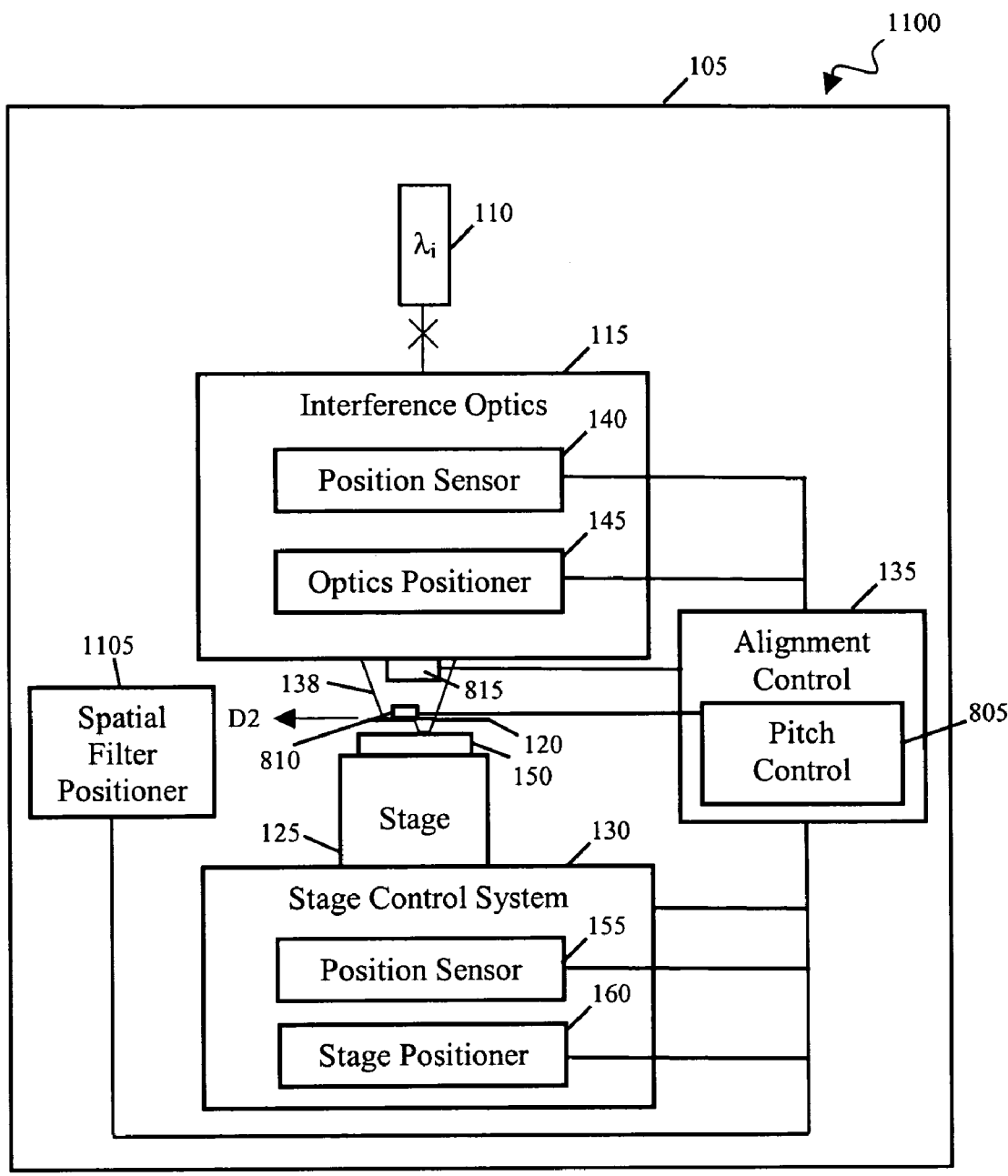
FIG. 11 shows another implementation of an interference pattern scanning lithography system.

FIG. 11 illustrates another implementation of a system for interference lithographic patterning. In particular, a system 1100 includes a spatial filter positioner 1105. Spatial filter positioner 1105 includes one or more transductive elements and displacement devices for translating spatial filter 120 in a direction D2. For example, positioner 1105 can include any of an interferometric transducer, a linear variable differential transducer, a resistive transducer, a piezoelectric transducer, a motor, and a device including a piezoelectric displacement element.

Spatial filter positioner 1105 translates spatial filter 120 to expose appropriate portions of a substrate to appropriate portions of interference pattern 415. During this translation, pitch control 805 can regulate the pitch of an interference pattern of lines and spaces. This regulation thus adjusts the pitch of newly patterned features to prevent misregistration with preexisting features.

Figure 12:
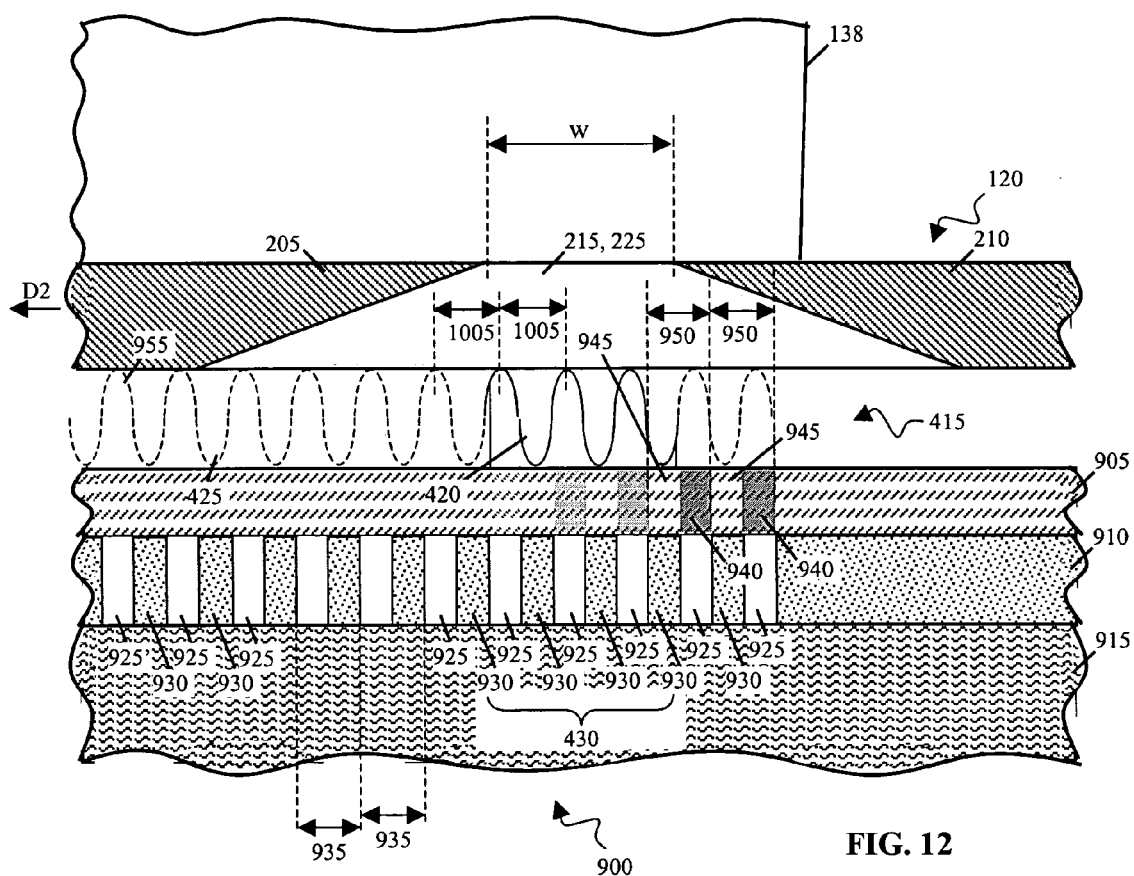
FIG. 12 show a stage in the interference lithographic patterning of a substrate.

FIG. 12 illustrates the translation of spatial filter 120 with pitch regulation by pitch control 805. In particular, during the operation of system 1100, spatial filter 120 is translated in the direction D2. Pitch control 805 regulates the positioning of optical elements in interference optics 115 to change interference pattern pitch 1005.

A number of implementations of the invention have been described. Nevertheless, it will be understood that various modifications may be made. Feature detector 815 can be external to interference optics 115. Different interference patterns can be used in printing. For example, an orthogonal pair of sets of interference fringes can be used to print an array of contacts. Features previously printed on a substrate need not be lines and spaces. For example, the previously printed features can include vias or other elements. Interferometric patterning need not be performed across the entirety of a substrate. For example, spatial filter 120 can include a switching element that alternatively opens and closes aperture 225. The length L of aperture 225 need not span an entire substrate and they may be modifiable during printing to selectively print different features at different locations. Two spatial filter elements can be used in series and can be made movable relative to one another. The interference pattern itself can be modified (e.g., by turning the pattern on and off or by changing the relative width of lines and spaces in the interference pattern) to selectively print different features at different locations on a substrate. Other transduction, sensing, and displacement systems and techniques can be used. The positioning of transduction and sensing elements within the interference patterning system can be changed. For example, spatial filter 120 can include pitch sensor 810. A variety of substrates, including substrates other than semiconductor wafers, can be patterned. Substrates can include additional features and/or layers. For example, a substrate can include a polymeric anti-reflective coating (top ARC). Accordingly, other implementations are within the scope of the following claims.

What is claimed is:

1. A system, comprising:
    an interference pattern generator to generate, at a first location, an interference pattern including an interference fringe;
    a spatial filter to limit, the area at the first location actually illuminated by the interference pattern; and
    a positioner to displace the actually illuminated area across the first location in a direction crossing the interference fringe and to maintain a substantially constant position of the interference pattern relative to the first location despite the displacement.

2. The system of claim 1, wherein:
    the interference pattern generator is to generate an interference pattern to illuminate a substrate at the first location;
    the spatial filter is to limit the area of the substrate actually illuminated by the interference pattern; and
    the positioner is to displace the actually illuminated area across the substrate in a direction crossing the interference fringe and to maintain the substantially constant position of the interference pattern relative to the substrate despite the displacement.

3. The system of claim 1, wherein the positioner is to maintain the position of the interference pattern relative to the first location constant to within a pitch of the interference pattern in the illuminated area.

4. The system of claim 3, wherein the positioner is to maintain the position of the interference pattern relative to the first location constant to within 1% of the pitch of the interference pattern in the illuminated area.

5. The system of claim 1, wherein the positioner comprises:
    a first positioner to displace the interference pattern in a direction D relative to the spatial filter; and
    a second positioner to displace the substrate in the direction D relative to the spatial filter.

6. The system of claim 1, wherein the positioner comprises a spatial filter positioner to displace the spatial filter relative to the interference pattern and the substrate.

7. The system of claim 1, further comprising a pitch controller to control a pitch of the interference pattern.

8. The system of claim 1, wherein the spatial filter comprises an aperture having a first dimension and a second dimension, the first dimension being greater than the second dimension and oriented to allow two or more wavefronts forming the interference pattern to illuminate the substrate at a substantially uniform angle.

9. The system of claim 1, wherein the positioner comprises a closed loop control system to maintain the substantially constant position of the interference pattern relative to the first location.

10. The system of claim 1, wherein the positioner is to displace the actually illuminated area across the first location in a direction substantially perpendicular to the interference fringe.

11. The system of claim 1, wherein the interference pattern generator comprises a source of electromagnetic radiation suitable for exposing a photoresist.

12. The system of claim 2, wherein the substrate comprises a photoresist that is sensitive to an electromagnetic radiation that forms the interference pattern generated by the interference pattern generator.

13. The system of claim 7, wherein the pitch controller comprises a control loop to dynamically control the pitch as the illuminated area is displaced across the substrate.

14. The system of claim 7, wherein the pitch controller is to control the pitch of the interference pattern to achieve a substantially constant pitch in the illuminated area.

* * * * *